US012733482B2

(12) United States Patent
Murthy et al.

(10) Patent No.: US 12,733,482 B2
(45) Date of Patent: Sep. 8, 2026

(54) ETCH STOP LAYER FOR BACKSIDE PROCESSING ARCHITECTURE

(71) Applicant: Intel Corporation, Santa Clara, CA (US)

(72) Inventors: Anand Murthy, Portland, OR (US); Prashant Majhi, San Jose, CA (US); Prahalad Parthangal, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 354 days.

(21) Appl. No.: 17/551,393

(22) Filed: Dec. 15, 2021

(65) Prior Publication Data

US 2023/0187273 A1 Jun. 15, 2023

(51) Int. Cl.
*H10W 20/41* (2026.01)
*H10W 20/00* (2026.01)
(Continued)

(52) U.S. Cl.
CPC ....... *H10W 20/435* (2026.01); *H10W 20/074* (2026.01); *H10W 20/40* (2026.01);
(Continued)

(58) Field of Classification Search
CPC ............. H01L 21/76829; H01L 23/522; H01L 23/5283; H01L 23/5286; H10W 20/20; H10W 20/42; H10W 20/435
See application file for complete search history.

(56) References Cited

U.S. PATENT DOCUMENTS 11,309,241 B2 * 4/2022 Yang ................. H01L 21/76885
2018/0145030 A1 5/2018 Beyne et al.
(Continued)

FOREIGN PATENT DOCUMENTS

CN 107039372 A 8/2017
CN 113555313 A 10/2021
(Continued)

OTHER PUBLICATIONS

International Preliminary Report on Patentability received for PCT/US2022/079209, dated Jun. 13, 2024. 6 pages.
(Continued)

*Primary Examiner* — Joseph C. Nicely
(74) *Attorney, Agent, or Firm* — Arcane Law PLLC

(57) ABSTRACT

An integrated circuit structure includes a first layer comprising silicon and at least one of carbon, oxygen, or hydrogen, and a device layer including a plurality of transistors above the first layer. A first interconnect structure is above the device layer and includes first conductive interconnect features. A second interconnect structure is below the first layer and includes second conductive interconnect features. In an example, one or more of the second conductive interconnect features pass through a bottom surface of the first layer. One or more third conductive interconnect features vertically extend through the device layer to a top surface of the first layer. In an example, the one or more third conductive interconnect features are in contact with the corresponding one or more of the second conductive interconnect features that pass through the bottom surface of the first layer.

20 Claims, 7 Drawing Sheets

(51) Int. Cl.

| | |
|---|---|
| ***H10W 20/40*** | (2026.01) |
| ***H10W 20/42*** | (2026.01) |
| *H10W 20/20* | (2026.01) |

(52) U.S. Cl.

CPC ......... *H10W 20/42* (2026.01); *H10W 20/427* (2026.01); *H10W 20/033* (2026.01); *H10W 20/056* (2026.01); *H10W 20/081* (2026.01); *H10W 20/20* (2026.01); *H10W 20/425* (2026.01)

(56) References Cited

U.S. PATENT DOCUMENTS

| | | | | |
|---|---|---|---|---|
| 2020/0098776 | A1* | 3/2020 | Sugisaki | H10D 88/00 |
| 2020/0098921 | A1 | 3/2020 | Rachmady et al. | |
| 2020/0411509 | A1* | 12/2020 | Yang | G11C 7/1006 |
| 2021/0098407 | A1 | 4/2021 | Elsherbini et al. | |
| 2021/0175124 | A1 | 6/2021 | Rao et al. | |
| 2021/0280603 | A1* | 9/2021 | Fujiki | H01L 21/76897 |
| 2021/0287997 | A1* | 9/2021 | Chen | H01L 24/19 |
| 2021/0335707 | A1 | 10/2021 | Sasaki et al. | |
| 2021/0358848 | A1* | 11/2021 | Wu | H01L 21/768 |
| 2021/0375723 | A1* | 12/2021 | Lin | H01L 23/5283 |
| 2021/0375761 | A1* | 12/2021 | Chang | H10D 84/0167 |
| 2021/0375861 | A1 | 12/2021 | Chung et al. | |
| 2021/0398898 | A1* | 12/2021 | Yang | H01L 21/76885 |
| 2022/0115510 | A1* | 4/2022 | Yu | H10D 30/6219 |
| 2022/0328363 | A1* | 10/2022 | Chou | H10D 30/014 |
| 2022/0367505 | A1* | 11/2022 | Chen | H01L 24/08 |
| 2022/0384311 | A1* | 12/2022 | Oh | H10D 84/038 |
| 2023/0197612 | A1* | 6/2023 | Majhi | H01L 23/481 257/774 |
| 2023/0197614 | A1* | 6/2023 | Majhi | H01L 23/5286 257/774 |
| 2024/0379423 | A1* | 11/2024 | Chang | H01L 21/28556 |

FOREIGN PATENT DOCUMENTS

| | | | |
|---|---|---|---|
| TW | 200725839 | A | 7/2007 |
| TW | 200746358 | A | 12/2007 |
| TW | 201826547 | A | 7/2018 |
| TW | 201913977 | A | 4/2019 |
| TW | 202036870 | A | 10/2020 |

OTHER PUBLICATIONS

International Search Report and Written Opinion received for PCT application No. PCT/US2022/079209. Mail Date: Mar. 10, 2023. 11 pages.

* cited by examiner

ETCH STOP LAYER FOR BACKSIDE PROCESSING ARCHITECTURE

BACKGROUND

Fabrication of microelectronic devices involves forming electronic components on microelectronic substrates, such as silicon wafers. These electronic components may include transistors, resistors, capacitors, and other active and passive devices, with overlying interconnect features (e.g., vias and lines) to route signals and power to and/or from the electronic components. Scaling of microelectronic devices results in high density of scaled interconnect features. One approach to circumvent congestion of front side interconnects due to power and signal routing includes the use of a backside power delivery network (PDN) and buried or backside power rail (BPR) technology. However, there remain a number of non-trivial challenges with respect to scaled interconnects.

Figure 1A:
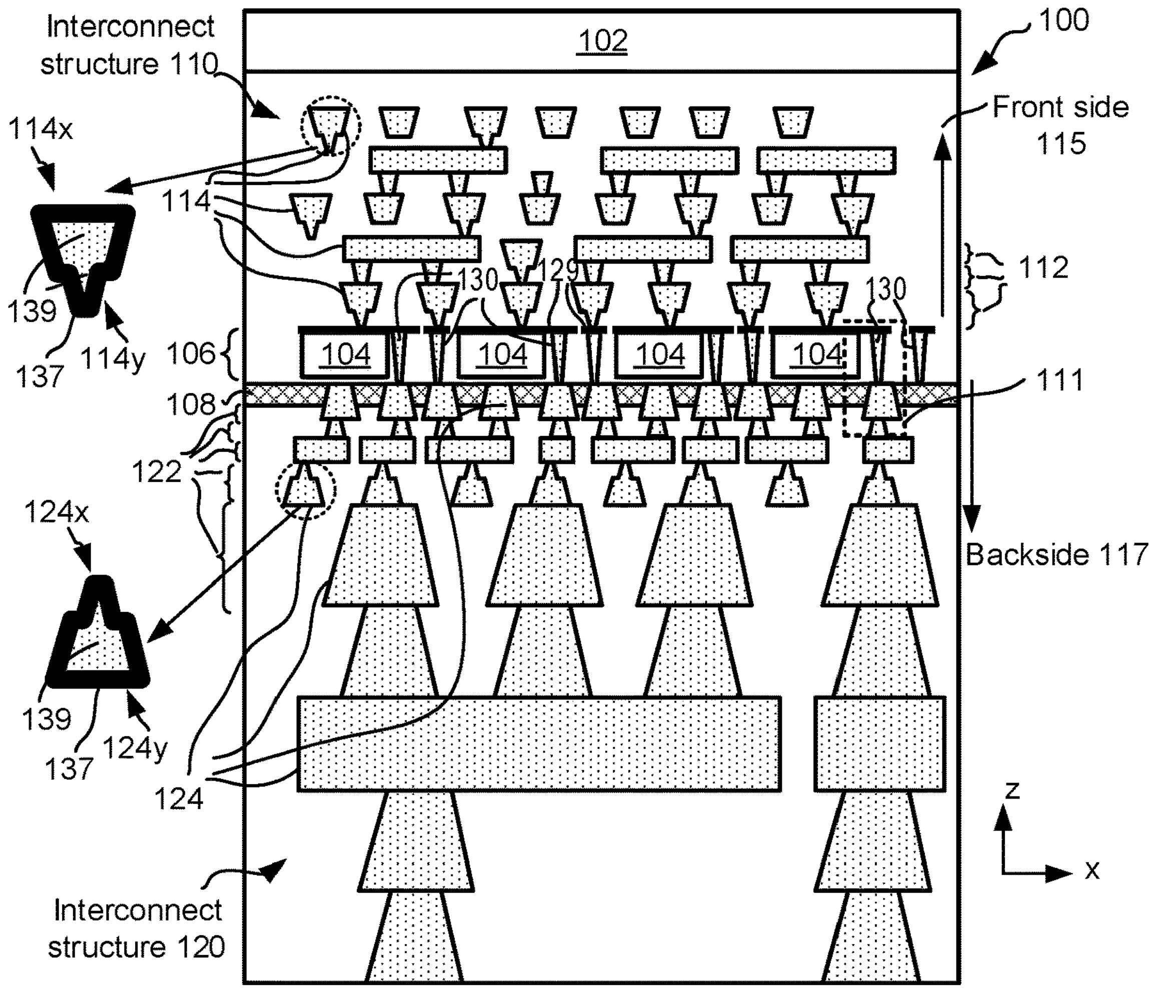
FIG. 1A illustrates a cross sectional view of a section of an integrated circuit (IC) comprising a carbon and/or oxygen containing layer below a device layer, where the carbon and/or oxygen containing layer acts (i) as an etch stop layer when forming one or more conductive interconnect features vertically extending through the device layer, and (ii) also as an etch stop layer for a backside thinning process during formation of the IC, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles (e.g., curved or tapered sidewalls and round corners), and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Provided herein is an integrated circuit structure including an etch stop layer used as (i) an etch stop layer for deep conductive via and/or BPR formation and (ii) an etch stop layer for thinning of backside sacrificial substrate. The etch stop can have a number of configurations, but in some cases comprises carbon, oxygen, and/or hydrogen. In one such example embodiment, an integrated circuit device includes a first layer comprising silicon and at least one of carbon, oxygen, or hydrogen, and a device layer including a plurality of transistors and above the first layer. A first interconnect structure is above the device layer and includes one or more first interconnect layers, where the one or more first interconnect layers include first conductive interconnect features. A second interconnect structure is below the device layer and the first layer, where the second interconnect structure includes one or more second interconnect layers, and where the one or more second interconnect layers includes second conductive interconnect features. In an example, one or more of the second conductive interconnect features pass through a bottom surface of the first layer. In an example, one or more third conductive interconnect features (e.g., deep vias and/or BPRs) vertically extend through the device layer to a top surface of the first layer. In an example, the one or more third conductive interconnect features are in contact with the corresponding one or more of the second conductive interconnect features that pass through the bottom surface of the first layer.

In another embodiment, an integrated circuit device includes a layer comprising silicon and carbon, a first interconnect feature extending vertically above the layer, and a second interconnect feature below the layer and passing through a bottom surface of the layer. In an example, the first interconnect feature is tapered towards the bottom, such that a first width of the first interconnect feature measured at or near a top surface of the first interconnect feature is at least 5% greater than a second width of the first interconnect feature measured at or near a bottom surface of the first interconnect feature. In an example, the first interconnect feature is in contact with the second interconnect feature. In an example, the second interconnect feature is tapered towards the top, such that a third width of the second interconnect feature measured at or near a top surface of the second interconnect feature is at least 5% less than a fourth width of the second interconnect feature measured at or near a bottom surface of the second interconnect feature. The first, second, third, and fourth widths are measured in a horizontal direction that is parallel to a length of the layer.

In yet another embodiment, a method of forming an integrated circuit comprises forming a substrate and a layer on the substrate, where the layer comprises silicon and carbon. The method further comprises forming a device layer on or otherwise above the layer, forming a recess vertically extending through the device layer and stopping at the layer, and forming a first interconnect feature (e.g., deep vias and/or BPRs) within the recess. The method further comprises forming a first interconnect structure above the device layer and including one or more first interconnect layers. In an example, the one or more first interconnect layers includes second conductive interconnect features. The method further comprises bonding a carrier wafer above the first interconnect structure, to facilitate subsequent backside processing of the overall structure in an inverted state; other embodiments may not use a carrier wafer. For purpose of discussion, assume the overall structure is not inverted. The method further comprises removing a section of the substrate below the layer. For example, a bottom surface of the layer is exposed due to the removal of the section of the substrate. The method further comprises forming a second interconnect structure below the device layer and the layer. In an example, the second interconnect structure includes one or more second interconnect layers, where the one or more second interconnect layers includes third conductive interconnect features, and where one of the third conductive interconnect features pass through a bottom surface of the layer and contacts the second interconnect feature. Numerous variations, embodiments, and applications will be apparent in light of the present disclosure.

General Overview

As previously noted, non-trivial issues remain with respect to implementing buried or backside power rail (BPR) and backside power delivery network (PDN) architecture. For instance, an IC with BPRs and/or a backside PDN include one or more BPRs and/or one or more deep conductive vias extending vertically through the device layer. The deep conductive vias couple the backside PDN to the device layer and/or to a front side interconnect structure. The BPR is a buried power rail (e.g., buried within or below the device layer) supplying power to one or more devices of the device layer. Note that etching through the device layer to form the recesses, within which the BPRs and/or the deep conductive vias are to be formed, is a time-based etch. As it turns out, there are a number of factors that result in non-uniformity in etch depths for the recesses of the deep conductive vias and/or the BPRs, such as the relatively high aspect ratio of the recesses as well as the density and/or geometric diversity of the recesses. For instance, micro-loading can cause non-uniformity of etch rates, which in turn causes different etch depths. Such recess depth non-uniformity may increase the challenge of successful yields.

Accordingly, techniques are provided herein to form an IC that has an etch stop layer below the device layer. In an example, the etch stop layer comprises silicon, carbon, and one or both of oxygen and hydrogen, and acts as an etch stop layer for various formation processes of the IC. In an example, the etch stop layer is etch selective relative to the dielectric material of the device layer. For example, when forming recesses for deep conductive vias and/or BPRs within the dielectric and/or semiconductor material of the device layer, the etching process does not substantially etch (e.g., minimal etching with no punch-through) the etch stop layer. Thus, the recesses within the device layer stop consistently at the etch stop layer. This results in a relatively uniform etch depth for the recesses. Subsequently, deep conductive vias and/or BPRs may be formed within the recesses. In this sense, the etch stop layer reduces the non-uniformity that results from a time-based etch done with no etch stop.

Additionally, in an example, a backside sacrificial substrate of the IC can be thinned, and such a thinning process stops on the underside of the etch stop layer. Once thinned, a backside interconnect structure and/or PDN can be formed, and the deep vias can be used to contact conductive features of the backside interconnect structure and/or PDN. Note that to facilitate backside thinning process, a carrier wafer can be bonded to a front side of the IC, and the overall resulting structure can then be inverted.

Thus, in an example, the resultant IC has a device layer comprising a plurality of active devices, such as transistors. An etch stop layer is below the device layer, where the etch stop layer comprises one or more of carbon, oxygen, an/or hydrogen. A first plurality of interconnect features, such as deep conductive vias and BPRs, vertically extend through the device layer and land on the etch stop layer. For example, individual ones of the first plurality of interconnect features comprise conductive material, and barrier layers on walls of the conductive material. In an example, barrier layers on bottom surfaces of the first plurality of interconnect features are directly on the etch stop layer. The BPRs, if present, can be used to supply power to corresponding terminals of the active devices of the device layer. In an example, the BPRs are powered by a backside PDN. In another example, the BPRs may be powered by a front side PDN.

A first interconnect structure is formed above the device layer. The first interconnect structure is a front side interconnect structure (e.g., as it is on front side of the active devices of the device layer), and includes one or more front side interconnect layers. The one or more front side interconnect layers include front side conductive interconnect features.

A second interconnect structure is below the device layer and the etch stop layer. The second interconnect structure is a backside interconnect structure (e.g., as it is on back side of the active devices of the device layer) and includes one or more back side interconnect layers. The one or more back side interconnect layers include back side conductive interconnect features.

In an example, the front side conductive interconnect features route signals between the plurality of active devices of the device layer. In an example, the back side conductive interconnect features route signals (i) between the plurality of active devices of the device layer and (ii) from or to one or more input or output (I/O) pins. Thus, the IC may be coupled to external components (such as a printed circuit board) from the back side of the IC. A front side of the IC may include a carrier wafer or substrate on top of the front side interconnect structure, where the carrier wafer provides structural integrity to the IC (e.g., during and after the above discussed sacrificial backside thinning and removal process).

At least some of the deep conductive vias and BPRs extending through the device layer may be connected to one or more of the active devices by corresponding conductors of the device layer. At least some of the deep conductive vias and BPRs extending through the device layer may also be connected to the frond side interconnect features and/or backside interconnect features. Thus, at least some of the deep conductive vias may interconnect corresponding ones of the front side interconnect features with corresponding backside interconnect features.

In an example, at least some of the back side conductive interconnect features pass through a bottom surface of the etch stop layer (e.g., comprising carbon, oxygen, and/or hydrogen) and contact corresponding ones of the deep conductive vias and/or the BPRs. For example, a barrier layer on a top surface of one such back side conductive interconnect feature may be in direct contact with another barrier layer of a bottom surface of one such deep conductive via or the BPR.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may be used to detect a etch stop layer below a device layer, where interconnect features (e.g., deep vias and/or BPRs) extending through the device layer stop at the etch stop layer, and where such an interconnect feature is connected to a corresponding backside interconnect feature of a backside interconnect structure. A backside thinning or grinding process that stops in or on the etch stop may also be apparent.

Numerous configurations and variations will be apparent in light of this disclosure.

Architecture and Methodology

Figure 1B:
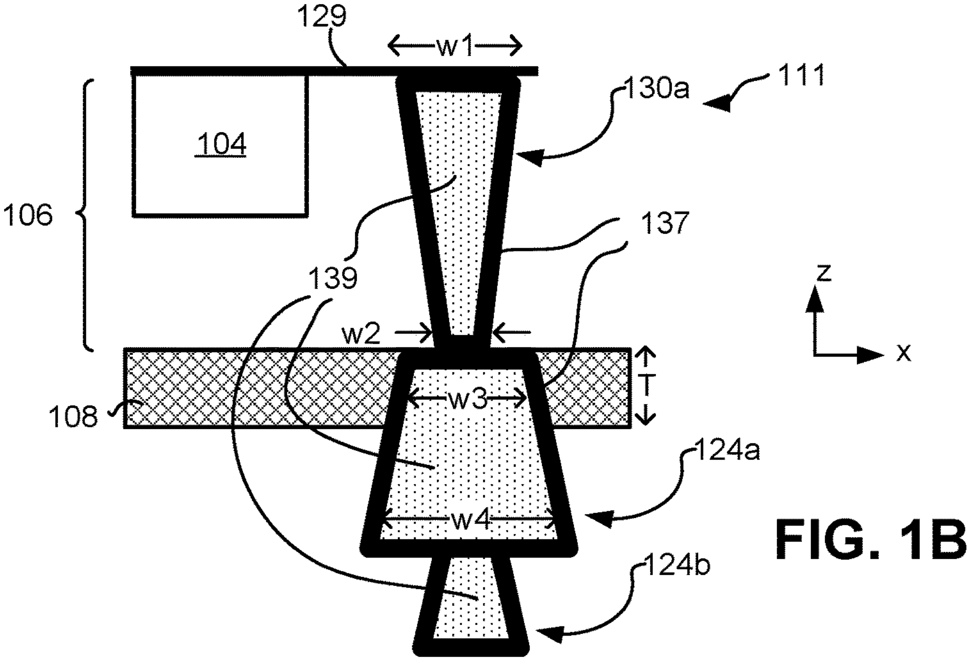
FIG. 1B illustrates a magnified view of a section of the IC of FIG. 1A, in accordance with an embodiment of the present disclosure.

FIG. 1A illustrates a cross sectional view of a section of an integrated circuit (IC) 100 comprising a carbon and/or oxygen containing layer 108 below a device layer 106, where the device layer 106 includes a plurality of active and/or passive devices such as transistors 104, and where the carbon and/or oxygen containing layer 108 acts (i) as an etch stop layer when forming one or more conductive interconnect features 130 vertically extending through the device layer 106, and (ii) also as an etch stop layer for a backside thinning during formation of the IC 100, in accordance with an embodiment of the present disclosure. FIG. 1B illustrates a magnified view of a section 111 of the IC 100 of FIG. 1A, in accordance with an embodiment of the present disclosure.

Referring to FIG. 1A, as illustrated, the device layer 106 includes a plurality of active and/or passive devices, such as transistors 104. The device layer 106 may represent a region that includes active and passive devices, such as transistors and/or other types of active or passive devices. In an example, the device layer 106 may include dielectric material, such as interlayer dielectric (ILD), at least in part encapsulating the transistors. The device layer 106, in an example, may also include a substrate on which the transistors are formed. Although merely four transistors 104 are illustrated to be included in the device layer 106, the device layer 106 is likely to include a larger number of transistors. Individual ones of the transistors 104 can be of any appropriate type, such as a planar or a non-planar transistor, such as a FinFET, a forksheet transistor, a gate all around (GAA) transistor such as a nanoribbon transistor, a nanowire transistor, a nanosheet transistor, or another appropriate type of transistor. In an example, individual transistor 104 may include structures such as channel region, source region, drain region, and gate stack. The transistors 104 are symbolically illustrated in FIG. 1A using a rectangular shape, without illustrating the detailed structure of the transistors. In an example, in addition to (or instead of) the transistors 104, the device layer 106 may also include one or more other electronic components, such as diodes, resistors, capacitors, inductors.

In the orientation of the IC 100 illustrated in FIG. 1A, a section of the IC 100 above the device layer 106 is referred to herein as a front side 115 of the device layer 106, and another section of the IC 100 below the device layer 106 is referred to herein as a backside 117 of the of the device layer 106. The front side 115 and backside 117 are symbolically illustrated in FIG. 1A using respective arrows. In an example, the front side 115 and the backside 117 are respectively the front and backsides of individual transistors 104.

In one embodiment, the front side 115 of the IC 100 comprises a plurality of interconnect layers 112 (also referred to herein as "front side interconnect layers 112") forming an interconnect structure 110. Individual interconnect layer 112 comprises dielectric material and corresponding one or more conductive interconnect features 114. For example, the interconnect layers 112 comprise various front side metallization levels. Thus, the interconnect structure 110 on the front side 115 comprises the plurality of conductive interconnect features 114. The conductive interconnect features 114 are, for example, conductive vias, conductive lines, redistribution layers, and/or other suitable types of interconnect features. In an example, these interconnect features 114 are used to route signals and/or power between various devices (such as transistors 104) in the device layer 106 of the IC 100.

In one embodiment, the backside 117 of the IC 100 comprises a plurality of interconnect layers 122 (also referred to herein as "backside interconnect layers 112") forming a backside interconnect structure 120. Individual interconnect layer 122 comprise dielectric material and corresponding one or more conductive interconnect features 124. For example, the interconnect layers 122 comprise various backside metallization levels. Thus, the interconnect structure 120 on the backside 117 comprises the plurality of conductive interconnect features 124. The conductive interconnect features 124 are, for example, conductive vias, conductive lines, redistribution layers, and/or other suitable types of interconnect features. In an example, these interconnect features 124 are used to route signals and power to and/or from various devices (such as transistors 104) in the device layer 106 of the IC 100.

In an example, the IC 100 is accessed by outside circuits (such as a printed circuit board) from the backside 117. For example, the IC 100 comprises a substrate 102, which also acts as a carrier wafer during formation of the IC 100. For the orientation illustrated in FIG. 1A, the substrate 102 is on a top section of the IC 100. For example, the substrate 102 is above and bonded to the front side interconnect structure 110. As illustrated, in an example, the front side interconnect structure 110 may not extend through the substrate 102. Accordingly, in such an example, the IC 100 is accessed by outside circuits from the backside. However, in another example, one or more interconnect features 114 of the front side interconnect structure 110 may extend through the substrate 102, and the IC 100 may be accessed by outside circuits from the front side 115 as well.

In the example where the IC 100 is accessed by outside circuits from the backside 117, the interconnect features 114 of the front side interconnect structure 110 is for routing signals between the components of the device layer 106. For example, the interconnect features 114 of the front side interconnect structure 110 routes signals between the plurality of transistors 104 of the device layer 106.

In an example, the interconnect features 124 of the backside interconnect structure 120 is for (i) routing signals between the components of the device layer 106, and/or (ii) routing signals to and/or from one or more input/output pins (I/O) of the IC 100 (the I/O pins are not illustrated). Thus, the I/O pins are on the backside 117 of the IC 100, through which the IC 100 communicates with external circuits and components, such as a printed circuit board (PCB).

In an example, at least a section of the backside interconnect structure 120 is used to deliver power to the components (e.g., transistors 104) of the device layer 106. Thus, at least the section of the backside interconnect structure 120 acts as a backside power delivery network (PDN) for the IC 100.

Left side of FIG. 1 illustrates a magnified view of two interconnect features 114*x* and 114*y* on the front side 115 of the IC 100, and a magnified view of two other interconnect features 124*x* and 124*y* on the backside 117 of the IC 100.

The interconnect feature 114*x* may be a conductive line traversing into or out of the plane of the paper in which the figure is drawn. The interconnect feature 114*y* may be a conductive via coupling the conductive line 114*x* to another line. As illustrated, each of the interconnect features 114*x*, 114*y* comprises conductive material 139 within a recess, where the recess is within dielectric material of the corresponding interconnect layer 112. A barrier layer 137 is on walls of the interconnect features 114*x*, 114*y*. Thus, each of the conductive interconnect features 114*x*, 114*y* comprise the conducive material 139, and the barrier layer 137 that separates the conductive material 139 of the interconnect feature from adjacent dielectric material of the corresponding interconnect layer 112.

In an example, no barrier layer may be present between the conductive materials of the interconnect features 114*x* and 114*y*, as illustrated in FIG. 1A. In another example and contrary to the illustrations of FIG. 1A, the barrier layer 137 may be present between the conductive materials of the interconnect features 114*x* and 114*y*.

The interconnect features 124*x*, 124*y* also have similar structures, e.g., each comprises conductive material 139, and a barrier layer 137 that separates the conductive material 139 of the interconnect feature from adjacent dielectric material of the corresponding interconnect layer 122. The interconnect feature 124*y* may be a conductive line traversing into or out of the plane of the paper in which the figure is drawn. and the interconnect feature 124*x* may be a conductive via coupling the conductive line 124*y* to another line.

In an example, no barrier layer may be present between the conductive materials of the interconnect features 124 and 124*y*, as illustrated in FIG. 1A. In another example and contrary to the illustrations of FIG. 1A, the barrier layer 137 may be present between the conductive materials of the interconnect features 124*x* and 124*y*.

In an example, the conductive material 139 within interconnect features 114, 124 tends to diffuse through the adjacent dielectric material of the corresponding interconnect layer. In an example where the conductive material 139 is copper, the diffusion may result in formation of undesirable copper oxide. The barrier layer 137, in an example, prevents diffusion of the conductive material 139 to adjacent dielectric material of the interconnect layer 112. Furthermore, the barrier layer 137 facilitates better adhesion of the conductive material 139 on walls of the interconnect feature 114.

In an example, the barrier layer 137 has a thickness in the range of 1 to 5 nanometers (nm), or 2 to 10 nm, or 0.5 to 20 nm, or 3-20 nm. In an example, the barrier layer 137 has a thickness of at least 1 nm, or at least 3 nm, or at least 5 nm, or at least 7 nm. In an example, the barrier layer 137 has a thickness of at most 5 nm, or at most 10 nm, or at most 20 nm, or at most 30 nm.

Suitable materials for the barrier layer 137 include barrier layer refractory metals and alloys, cobalt, cobalt-nickel (CoNi), ruthenium-cobalt combination, molybdenum, nickel, manganese, titanium-tungsten (Ti), tantalum (Ta), tantalum-nitride (TaN), tantalum-silicon-nitride (TaSiN), titanium-nitride (TiN), titanium-silicon-nitride (TiSiN), tungsten (XV), tungsten-nitride (WN), tungsten-silicon-nitride (WiSiN), and/or combinations of such materials (e.g., a multi-lay stack of Ta/TaN). In an example, the conductive material 139 comprises suitable conductive materials such as pure copper, ruthenium, molybdenum, tungsten, aluminum, an alloy such as copper-tin (CuSn), copper indium (CuIn), copper-antimony (CuSb), copper-bismuth (CuBi), copper-rhenium (CuRe), and/or any other suitable conductive material.

In one embodiment, the IC 100 comprises a plurality of interconnect features 130 vertically extending through the device layer 106 and landing on the layer 108. Thus, the interconnect features 130 extend up to the layer 108. For example, as will be discussed herein later, the layer 108 acts as an etch stop layer when forming the interconnect features 130, and accordingly, the interconnect features 130 extend through the device layer 106 to the layer 108 (but doesn't extend through the layer 108). Thus, for example, a barrier layer 137 (see FIG. 1B) on a bottom surface of the interconnect feature 130 is co-planar or flush with a top surface of the layer 108.

In one embodiment, the layer 108 is etch selective relative to the dielectric material of the device layer 106. For example, a recess to form an interconnect feature 130 through the dielectric material of the device layer 106 stops at the etch stop layer 108, and hence, the etching process can selectively etch the dielectric material of the device layer 106, without etching the layer 108. For example, the device layer 106 comprises silicon, and the layer 108 may comprise silicon, carbon, and one or both of oxygen and hydrogen. In another example, the layer 108 comprises carbon (C)-doped silicon oxide.

In an example, the layer 108 has a thickness T (see FIG. 1B) in the range of 1 to 8 nanometers (nm), or 2 to 10 nm, or 0.5 to 20 nm, or 3 to 20 nm. In an example, the layer 108 has a thickness T of at least 2 nm, or at least 3 nm, or at least 5 nm, or at least 7 nm. In an example, the layer 108 has a thickness of at most 5 nm, or at most 10 nm, or at most 20 nm, or at most 30 nm. The thickness T is measured between the device layer 106 and a top one of the back side interconnect layers 122, in a direction that is perpendicular to a length of the layer 108.

In an example, one or more of the interconnect features 130 are deep conductive vias through the device layer 106, and connects the backside interconnect structure 120 to the transistors 104 and/or the front side interconnect structure 110. In an example, one or more other interconnect features 130 are buried or backside power rails (BPRs) to supply power to one or more of the transistors 104.

In one embodiment, the device layer 106 also comprises a plurality of conductors 129. In an example, one or more interconnect feature 130 are coupled to the interconnect structure 110 through corresponding one or more of the conductors 129. In an example, one or more other interconnect feature 129 are coupled to corresponding one or more transistors 104 through corresponding one or more of the conductors 129.

A section 111 of the IC 100 is identified using dotted lines in FIG. 1A, and FIG. 1B illustrates a magnified view of the section 111. Referring to FIGS. 1A and 1B, the section 111 illustrates two interconnect features 124*a* and 124*b* of the backside interconnect structure 120, an interconnect feature 130*a* extending through the device layer 106, and the layer 108.

As illustrated in FIGS. 1A and 1B, similar to the interconnect features 114*x* and 124*x* discussed herein earlier, the interconnect feature 130*a* also comprises conductive material 139. The barrier layer 137 separates the conductive material 139 of the interconnect feature 130*a* from adjacent dielectric material of the device layer 106. Similarly, each of the interconnect features 124*a*, 124*b* comprises conductive material 139, and the barrier layer 137 separates the conductive material 139 of the interconnect features 124*a*, 124*b* from adjacent dielectric material of the corresponding interconnect layer 122.

As discussed, in one embodiment, the interconnect feature 130*a* extends through the device layer 106 and stops at the layer 108. Thus, for example, the barrier layer 137 on the bottom surface of the interconnect feature 130 is coplanar with a top surface of the layer 108.

In one embodiment, the interconnect feature 124*a* extends through the layer 108 and contacts the interconnect feature 130*a*. For example, the interconnect feature 124*a* passes through a bottom surface of the layer 108, and contacts the interconnect feature 130*a* through the barrier layers 137 of the interconnect features 130*a* and 124*a*. Thus, the barrier layers 137 of the two interconnect features 124*a* and 130*a* are in direct contact with each other, as illustrated in FIG. 1B.

As illustrated in FIG. 1A, one or more of the interconnect features 114 of the front side interconnect structure 110 and one or more of the interconnect features 130 extending through the device layer 106 are tapered towards the bottom. For example, FIG. 1B illustrates the interconnect feature 130*a* having a width w1 at or near a top section of the interconnect feature 130*a*, and a width w2 at or near a bottom section of the interconnect feature 130*a*. The widths w1 and w2 are measured in a horizontal direction that is parallel to a length of the layer 108 (and that is perpendicular to a vertical direction of an imaginary line passing through both the interconnect features 130*a* and 124*a*). Because the interconnect feature 130*a* is tapered towards the bottom, the width w1 is greater than the width w2. For example, as will be discussed with respect to FIGS. 2, 3D, and 3E, the recesses for the interconnect features 114 and 130 are formed from the top side of the IC 100, and hence, individual ones of the interconnect features 114 and 130 (e.g., interconnect feature 130*a* of FIG. 1B) are tapered towards the bottom. The extent of tapering may depend on the etch technology used to form a recess for the corresponding interconnect feature. In an example, in FIG. 1B, width w1 is greater than width w2 by at least 1%, or by at least 2%, or by at least 5%, or by at least 10%, or by at least 15%.

As illustrated in FIGS. 1A and 1B, one or more of the backside interconnect features 124 of the backside interconnect structure 120 are tapered towards the top. For example, FIG. 1B illustrates the interconnect feature 124*a* having a width w3 at or near a top section of the interconnect feature 124*a*, and a width w4 at or near a bottom section of the interconnect feature 124*a*. The widths w3 and w3 are measured in a horizontal direction that is parallel to a length of the layer 108 (and that is perpendicular to a vertical direction of an imaginary line passing through both the interconnect features 130*a* and 124*a*). Because the interconnect feature 124*a* is tapered towards the top, the width w3 is less than the width w4. For example, as will be discussed with respect to FIGS. 2 and 3I-3K, the recess for the interconnect feature 124*a* is formed from the bottom or backside of the IC 200, and hence, the interconnect feature 124*a* is tapered towards the top. The extent of tapering may depend on the etch technology used to form a recess for the interconnect feature 124*a*. In an example, width w3 is less than width w4 by at least 1%, or by at least 2%, or by at least 5%, or by at least 10%, or by at least 15%.

Thus, put differently, the interconnect feature 130*a* tapered towards the bottom is conjoined with the interconnect feature 124*a* tapered towards the top. Furthermore, the interconnect feature 130*a* extends through the device layer 106 and extends up to the layer 108, and the interconnect feature 124*a* extends through the layer 108 to conjoin with the interconnect feature 130*a*.

Figure 2:
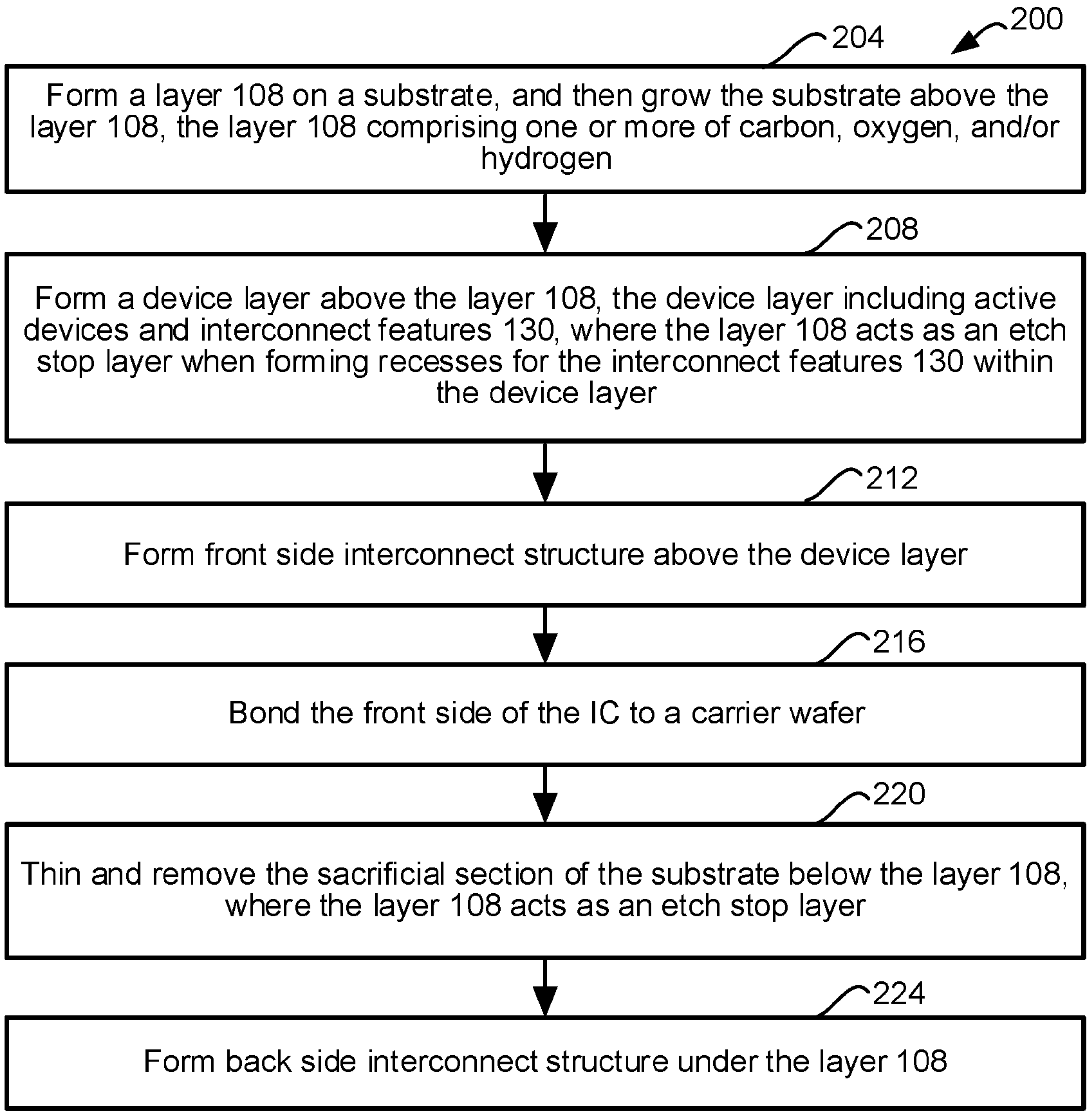
FIG. 2 illustrates a flowchart depicting a method of forming an IC (such as the IC of FIGS. 1A and 1B) comprising a carbon and/or oxygen containing layer below a device layer, where the carbon and/or oxygen containing layer acts (i) as an etch stop layer when forming one or more conductive interconnect features vertically extending through the device layer, and (ii) also as an etch stop layer for a backside thinning process during formation of the IC, in accordance with an embodiment of the present disclosure.

FIG. 2 illustrates a flowchart depicting a method 200 of forming an IC (such as the IC 100 of FIGS. 1A and 1B) comprising a carbon and/or oxygen containing layer below a device layer, where the carbon and/or oxygen containing layer acts (i) as an etch stop layer when forming one or more conductive interconnect features vertically extending through the device layer, and (ii) also as an etch stop layer for a backside thinning during formation of the IC, in accordance with an embodiment of the present disclosure. FIGS. 3A-3K illustrate cross-sectional views of an IC (such as the IC 100 of FIGS. 1A, 1B, and 2) in various stages of processing, in accordance with an embodiment of the present disclosure. FIGS. 2 and 3A-3K will be discussed in unison.

Referring to FIG. 2, the method 200 includes, at 204, forming a layer 108 on a substrate 302, and then growing the substrate above the layer 108. In an example, the substrate 302 comprises silicon, and the layer 108 comprises silicon, and one or more of carbon, oxygen, and/or hydrogen.

Figure 3A:
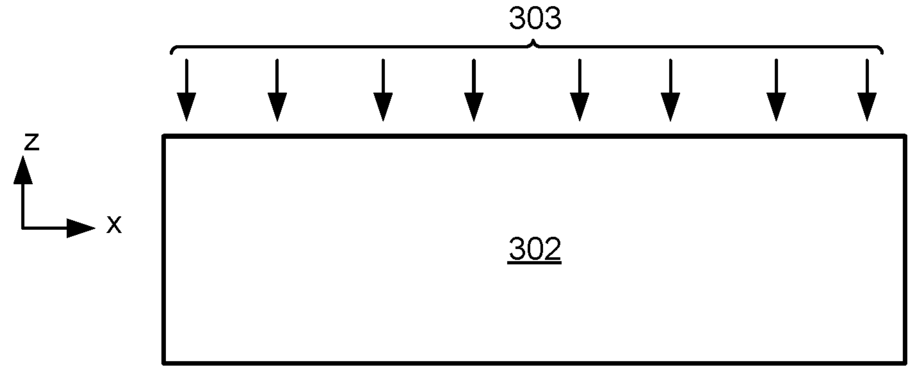
FIGS. 3A-3K illustrate cross-sectional views of an IC (such as the IC of FIGS. 1A, 1B, and 2) in various stages of processing, in accordance with an embodiment of the present disclosure.
Figure 3B:
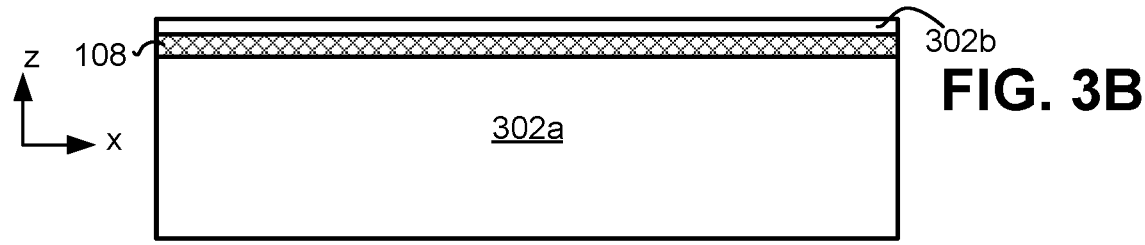
Figure 3C:
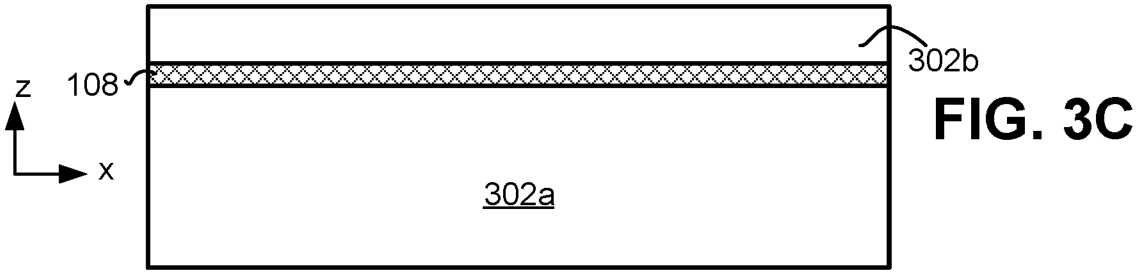

The layer 108 may be formed on the substrate 302 using a variety of techniques, such as molecular ion implant, or epitaxial deposition of the layer 108 on the substrate 302. FIGS. 3A-3B illustrate using ion implantation to form the layer 108 on the substrate 302. For example, molecular ions comprising one or more of carbon, hydrogen, and oxygen is used for the ion implantation process. FIG. 3A symbolically illustrates the ion implantation process using arrows 303. In an example and as illustrated in FIG. 3B, the resulting layer 108 may be formed at a configurable depth (e.g., based on the energy used during the ion implantation) within the substrate 302, such that the substrate 302 is divided in two sections: 302*a* below the layer 108 and 302*b* above the layer 108. The section 302*b* above the layer 108 is grown, e.g., via epitaxial deposition of material of the section 302, as illustrated in FIG. 3C. In an example, the section 302*b* comprises silicon.

Note that the section 302*a* is a sacrificial or dummy substrate used for structural integrity of the IC, e.g., while the device layer and the front side of the IC 100 is being processed. As will be discussed herein later in turn (e.g., see FIGS. 3F-3G), the sacrificial section 302*a* will eventually be removed, and replaced with a backside comprising the backside interconnect structure 120.

Referring again to FIG. 2, the method 200 proceeds from 204 to 208, where the device layer 106 is formed above the layer 108. For example, active devices (such as transistors 104) and interconnect features 130 are formed within the section 302*b*, to form the device layer 106. As discussed, the layer 108 acts as an etch stop layer when forming recesses for the interconnect features 130 within the device layer 106.

Figure 3D:
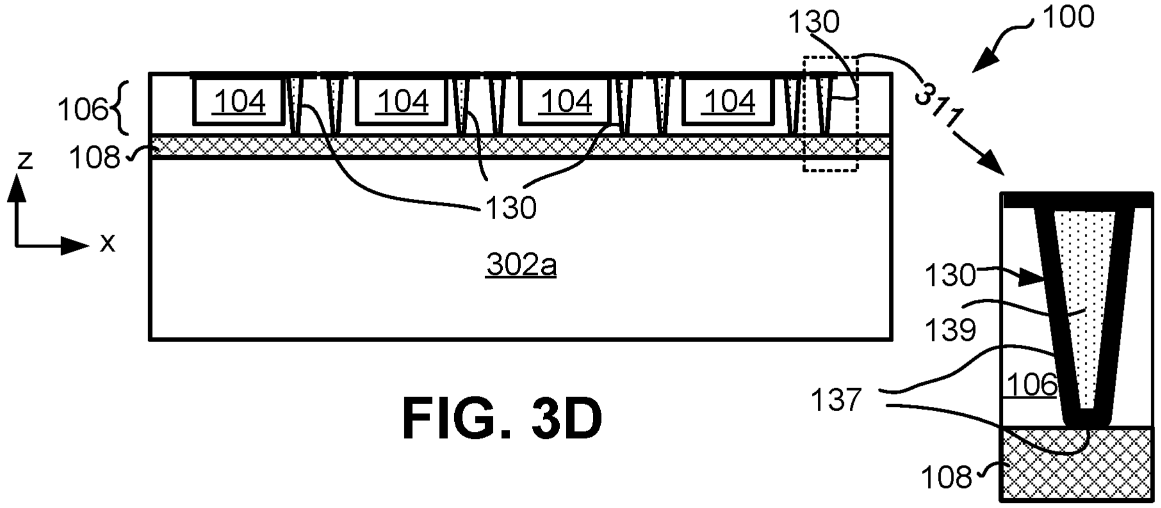

For example, as illustrated in FIG. 3D, the active devices (such as transistors 104) and the interconnect features 130 are formed within the section 302*b*, to form the device layer 106. When forming an interconnect features 130, a corresponding recess is formed within the dielectric material of the device layer 104, and the recess is lined with the barrier layer 137 and the conductive material 139, thereby forming the interconnect feature 130. As discussed, the layer 108 acts as an etch stop layer, when forming the recess within the dielectric material of the device layer 104. As also discussed, the dielectric material of the device layer 104 and the material of the layer 108 are different, such that the etching process form the recess within the device layer 104, without etching the layer 108.

Because the recess for an interconnect feature 130 stops at the top surface of the layer 108, a barrier layer on a bottom surface of the interconnect feature 130 is coplanar with and in direct contact with the top surface of the layer 108, as seen in the magnified view illustrated in FIG. 3D.

Figure 3E:
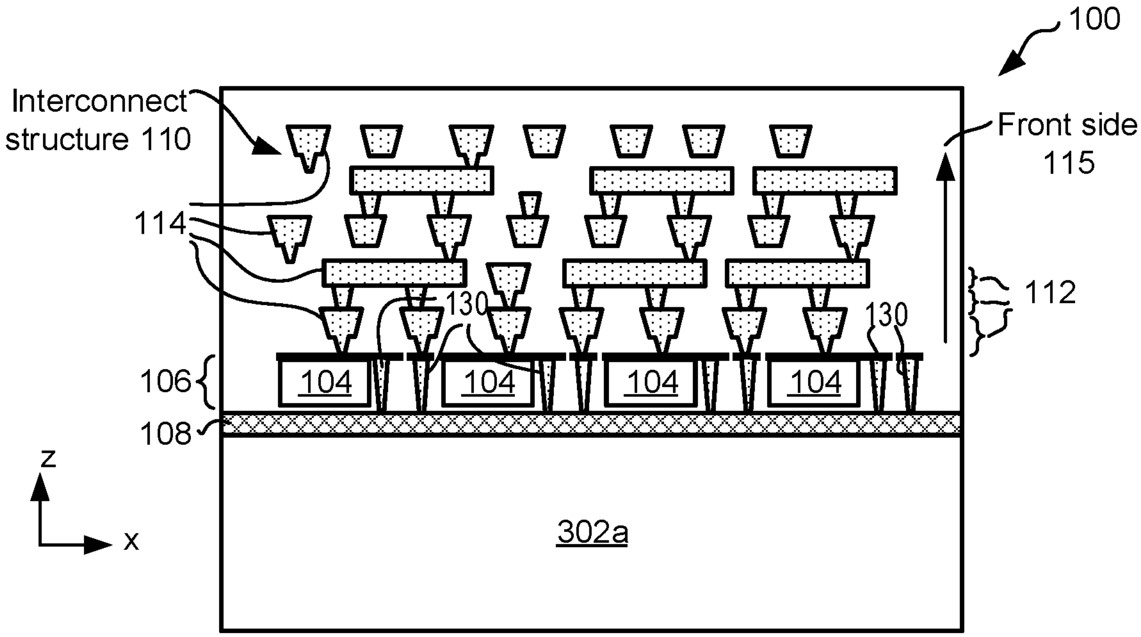

Referring again to FIG. 2, the method 200 then proceeds from 208 to 212, where front side interconnect structure 110 is formed above the device layer 106. For example, FIG. 3E illustrates the interconnect structure 110 formed above the device layer 106, where the interconnect structure 110 comprise interconnect layers 112, and where individual interconnect layer 112 comprises dielectric material and conductive interconnect features within the dielectric material, as discussed with respect to FIG. 1A. The interconnect structure 110 may be formed using any suitable technique for forming such interconnect structures. This completes the front side metallization of the IC 100.

Figure 3F:
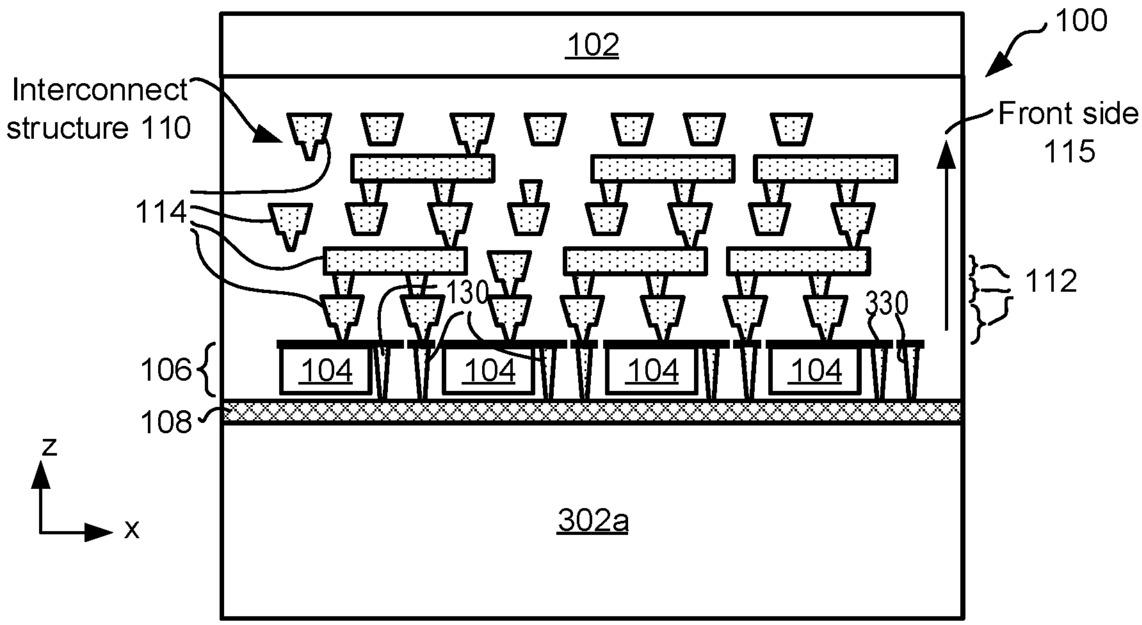

Referring again to FIG. 2, the method 200 proceeds from 212 to 216, where the front side of the IC 100 is bonded to a carrier wafer. FIG. 3F illustrates a top or front side of the IC 100 (i.e., the front side 115) bonded to the carrier wafer 102. The carrier wafer allows the overall structure to be inverted, to facilitate subsequent backside processing. Note that such inversion is not depicted, so as to allow orientation language (such as above and below) to be used consistently for ease of description.

Figure 3G:
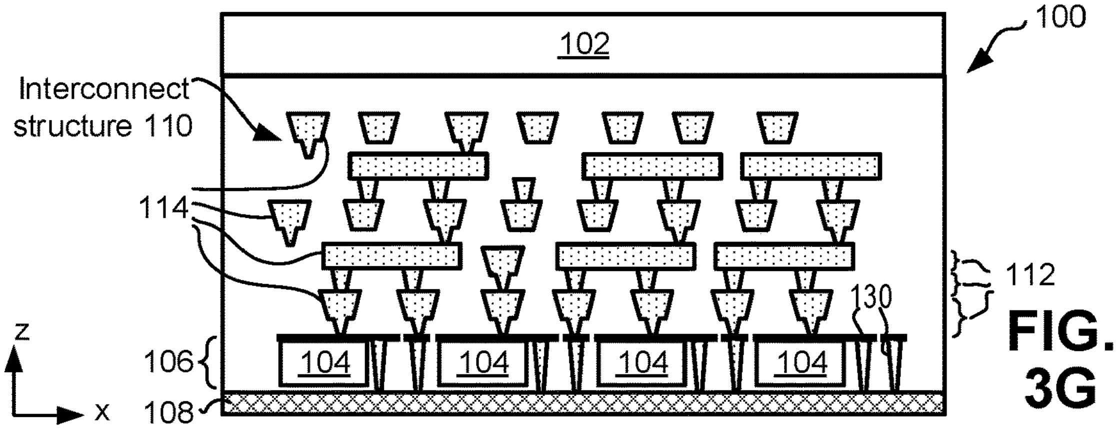
Figure 3H:
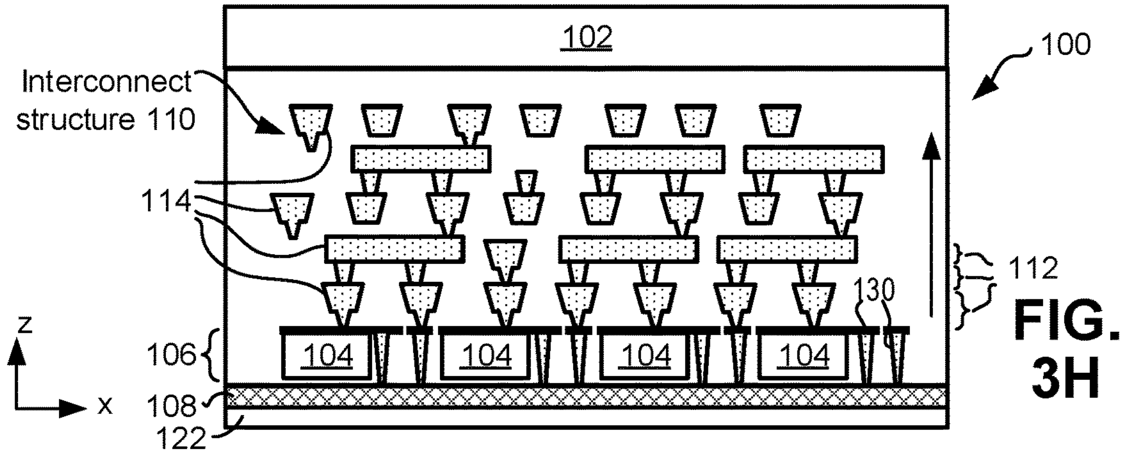

Referring again to FIG. 2, the method 200 proceeds from 216 to 220, where the sacrificial section 302*a* of the substrate 302 below the layer 108 is thinned and removed. In an example, the layer acts 108 as an etch stop layer during this process. Any etching technique, such as an isotropic etching technique, may be used. FIG. 3G illustrates the IC 100, after thinning and removal of the section 302*a* of the substrate 302 below the layer 108. As a result, the layer 108 is exposed through the bottom section of the IC 100, as illustrated in FIG. 3G.

Figure 3I:
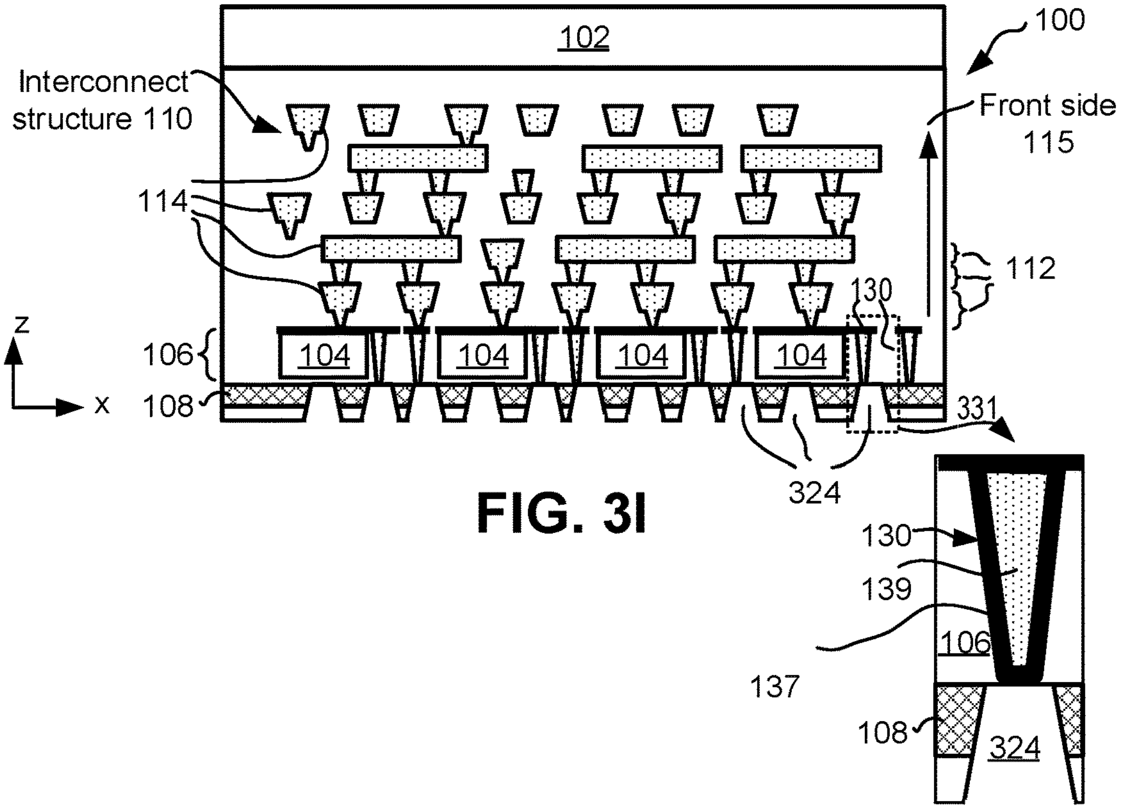
Figure 3J:
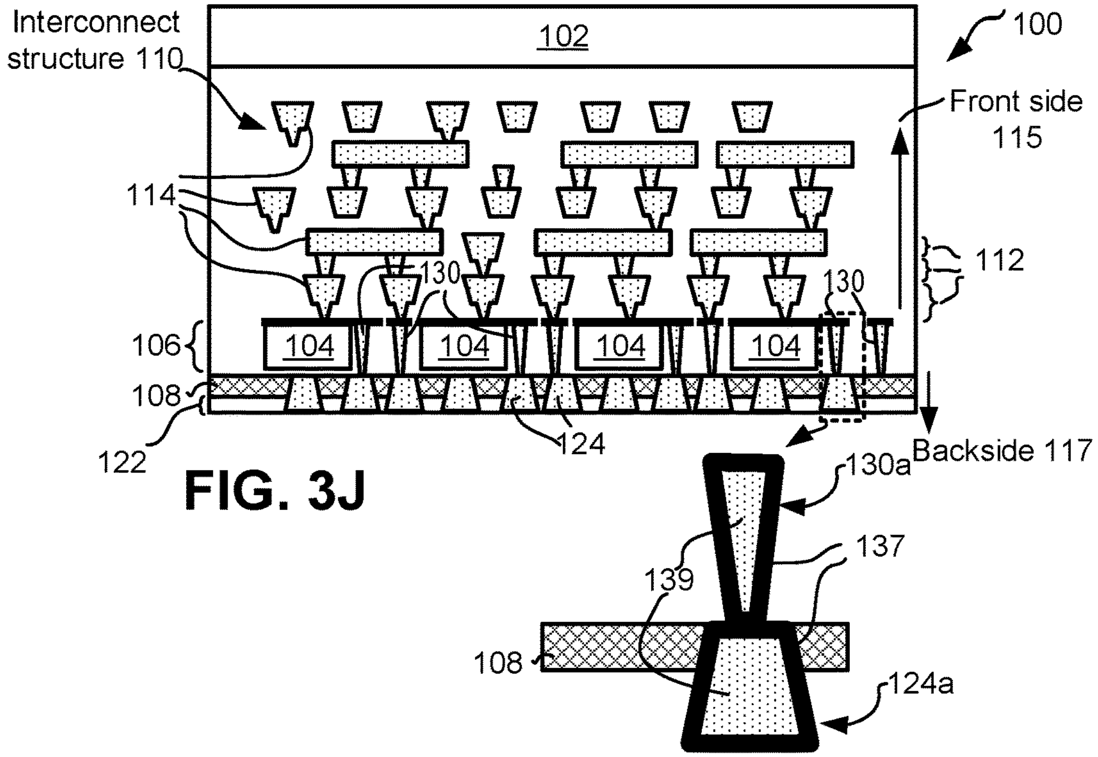
Figure 3K:
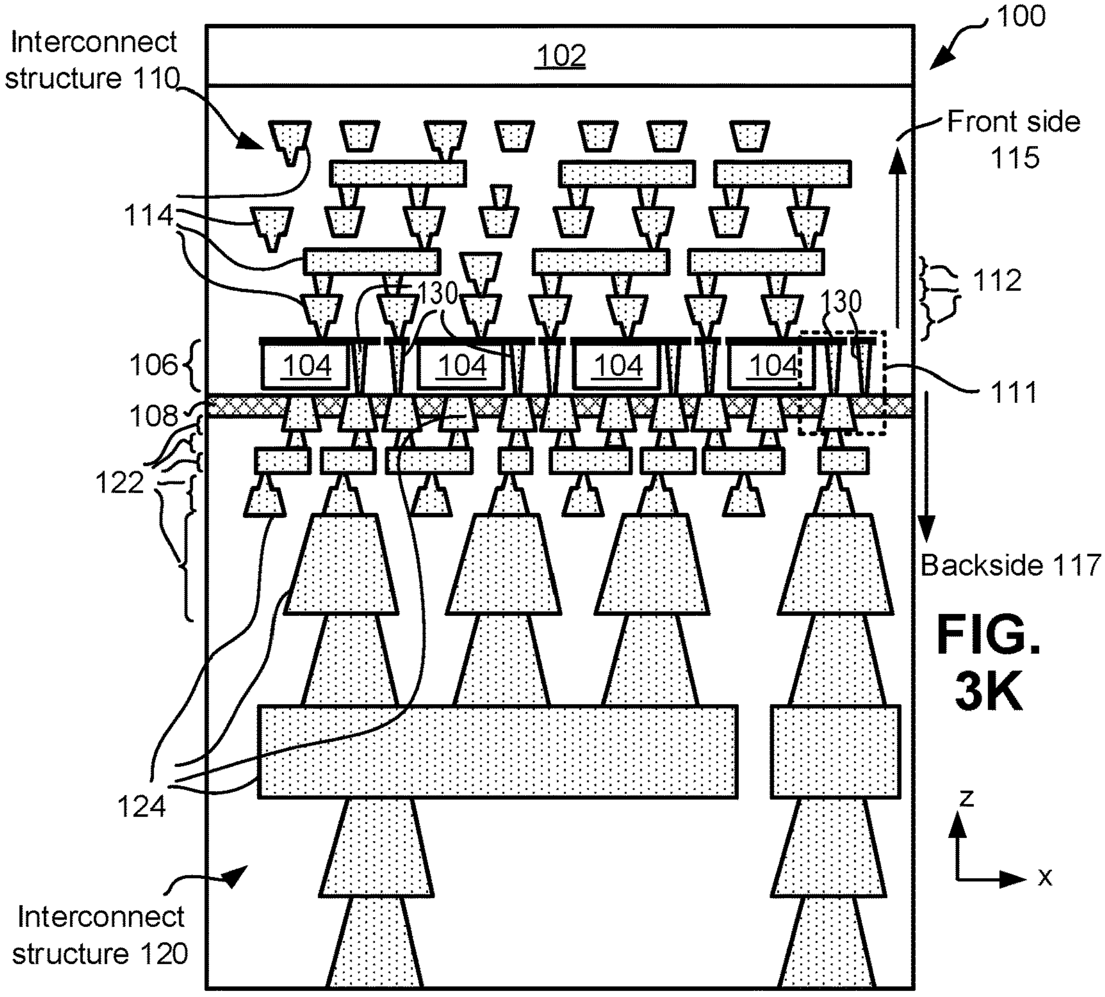

Referring again to FIG. 2, the method 200 proceeds from 220 to 224, where back side interconnect structure 120 below the layer 108 is formed. FIGS. 3H-3K illustrate the process to form the backside interconnect structure 120. For example, referring to FIG. 3H, dielectric material for a back side interconnect layer 122 is deposited below the layer 108, e.g., via any suitable deposition technique such as atomic layer epitaxy, chemical vapor deposition (CVD), physical vapor deposition (PVD), atomic layer deposition (ALD), vapor Phase epitaxy (VPE), molecular-beam epitaxy (MBE), liquid phase epitaxy (LPE), and/or another suitable deposition technique. Referring to FIG. 3I, the dielectric material is patterned, e.g., by forming recesses 324 within the dielectric material. As discussed with respect to FIG. 1B herein previously, the recesses 324 are tapered towards the top (see discussion with respect to widths w3 and w4 of FIG. 1B). Subsequently, the recesses 324 are lined with the barrier layer 137 and filed with conductive material 139, to form the interconnect features 124, as illustrated in FIG. 3J. FIG. 3J also illustrates a magnified view of one interconnect feature 130*a* and one interconnect feature 124*a*. Similar operations are repeated to form additional back side interconnect layers 122, to complete the back side interconnect structure 120, as illustrated in FIG. 3K. This completes formation the structure of the IC 100 discussed with respect to FIG. 1A.

Note that the processes in method 200 are shown in a particular order for ease of description. However, one or more of the processes may be performed in a different order or may not be performed at all (and thus be optional), in accordance with some embodiments. Numerous variations on method 200 and the techniques described herein will be apparent in light of this disclosure.

Example System

Figure 4:
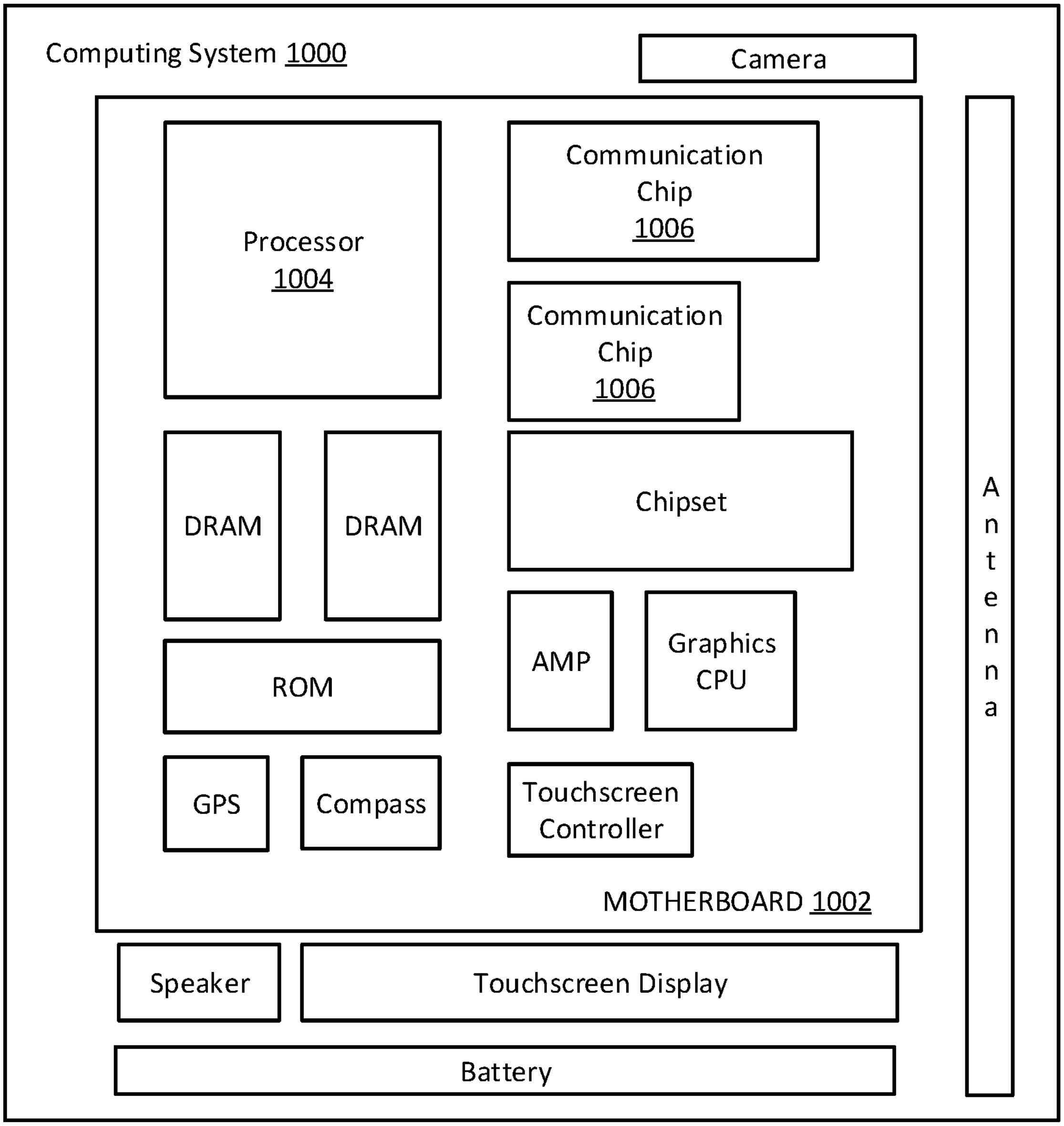
FIG. 4 illustrates a computing system implemented with integrated circuit structures having one or more interconnect features formed using the techniques disclosed herein, in accordance with some embodiments of the present disclosure.

FIG. 4 illustrates a computing system 1000 implemented with integrated circuit structures and/or the interconnect features formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1. An integrated circuit device comprising: a first layer comprising silicon and at least one of carbon, oxygen, or hydrogen; a device layer including a plurality of transistors and above the first layer; a first interconnect structure above the device layer and including one or more first interconnect layers, the one or more first interconnect layers including first conductive interconnect features; a second interconnect structure below the device layer and the first layer, the second interconnect structure including one or more second interconnect layers, the one or more second interconnect layers including second conductive interconnect features, wherein one or more of the second conductive interconnect features pass through a bottom surface of the first layer; and one or more third conductive interconnect features vertically extending through the device layer to a top surface of the first layer, the one or more third conductive interconnect features in contact with the corresponding one or more of the second conductive interconnect features that pass through the bottom surface of the first layer.

Example 2. The integrated circuit device of example 1, wherein the first conductive interconnect features route signals between the plurality of transistors.

Example 3. The integrated circuit device of any one of examples 1-2, wherein the second conductive interconnect features route signals (i) between the plurality of transistors and (ii) from or to one or more input or output (I/O) pins that are below the second interconnect structure.

Example 4. The integrated circuit device of any one of examples 1-3, wherein the second conductive interconnect features route power to the plurality of transistors.

Example 5. The integrated circuit device of any one of examples 1-4, wherein the first layer has a thickness in the range of 3-20 nm, where the thickness is measured between the device layer and a top one of the one or more second interconnect layers.

Example 6. The integrated circuit of any one of examples 1-5, wherein the first layer comprises oxygen and hydrogen.

Example 7. The integrated circuit of any one of examples 1-6, wherein the one or more third conductive interconnect features include first and second deep conductive vias, each deep conductive via connected to one or more of the transistors by a corresponding conductor of the device layer.

Example 8. The integrated circuit of any one of examples 1-7, wherein the one or more third conductive interconnect features include a buried or backside power rail (BPR) to transmit power to a terminal of a transistor of the plurality of transistors.

Example 9. The integrated circuit of any one of examples 1-8, wherein at least one of the first conductive interconnect features comprises conductive material, and a barrier layer separating the conductive material from adjacent dielectric material of a corresponding one of the one or more first interconnect layers.

Example 10. The integrated circuit of any one of examples 1-9, wherein at least one of the second conductive interconnect features comprises conductive material, and a barrier layer separating the conductive material from adjacent dielectric material of a corresponding one of the one or more second interconnect layers.

Example 11. The integrated circuit of any one of examples 1-10, wherein at least one of the second conductive interconnect features comprises conductive material, and a barrier layer separating the conductive material from the first layer.

Example 12. The integrated circuit of any one of examples 1-11, wherein at least one of the third conductive interconnect features comprises conductive material, and a barrier layer separating the conductive material from adjacent dielectric material of the device layer.

Example 13. The integrated circuit of any one of examples 1-12, wherein: at least one of the third conductive interconnect features comprises conductive material; the integrated circuit further comprises a barrier layer on walls of the at least one of the third conductive interconnect features; and a bottom surface of a section of the barrier layer on a bottom wall of the at least one of the third conductive interconnect features is coplanar with a top surface of the first layer.

Example 14. The integrated circuit structure of example 13, wherein the barrier layer comprises one or more of cobalt, nickel, ruthenium, molybdenum, manganese, titanium, tungsten, tantalum, nitrogen, silicon.

Example 15. The integrated circuit structure of any one of examples 13-14, wherein the conductive material comprises one or more of copper, ruthenium, molybdenum, tin, indium, antimony, aluminum, or bismuth.

Example 16. The integrated circuit of any one of examples 1-5, wherein the first layer comprises carbon.

Example 17. The integrated circuit of any one of examples 1-5, wherein the first layer comprises carbon and oxygen.

Example 18. The integrated circuit of any one of examples 1-5, wherein the first layer comprises carbon and hydrogen.

Example 19. The integrated circuit of any one of examples 1-5, wherein the first layer comprises carbon, oxygen, and hydrogen.

Example 20. An integrated circuit device comprising: a layer comprising silicon and carbon; a first interconnect feature extending vertically above the layer, wherein the first interconnect feature is tapered towards the bottom, such that a first width of the first interconnect feature measured at or near a top surface of the first interconnect feature is at least 5% greater than a second width of the first interconnect feature measured at or near a bottom surface of the first interconnect feature; and a second interconnect feature below the layer and passing through a bottom surface of the layer, wherein the first interconnect feature is in contact with the second interconnect feature, wherein the second interconnect feature is tapered towards the top, such that a third width of the second interconnect feature measured at or near a top surface of the second interconnect feature is at least 5% less than a fourth width of the second interconnect feature measured at or near a bottom surface of the second interconnect feature, and wherein the first, second, third, and fourth widths are measured in a horizontal direction that is parallel to a length of the layer.

Example 21. The integrated circuit device of example 20, further comprising: a first barrier layer on walls of the first interconnect feature, and a second barrier layer on walls of the second interconnect feature, wherein the first barrier layer of the first interconnect feature and the second barrier layer of the second interconnect feature are in direct contact with each other.

Example 22. The integrated circuit device of example 21, wherein the first interconnect feature is in contact with the second interconnect feature through the first and second barrier layers.

Example 23. The integrated circuit device of any one of examples 21-22, wherein the bottom surface of the first barrier layer is directly on the top surface of the layer.

Example 24. The integrated circuit structure of any one of examples 21-23, wherein the first and second barrier layers comprise one or more of cobalt, nickel, ruthenium, molybdenum, manganese, titanium, tungsten, tantalum, nitrogen, silicon.

Example 25. The integrated circuit of any one of examples 20-24, wherein the layer comprises at least one of oxygen or hydrogen.

Example 26. The integrated circuit of any one of examples 20-25, wherein the layer comprises oxygen and hydrogen.

Example 27. The integrated circuit of any one of examples 20-26, further comprising: a device layer comprising a plurality of transistors, wherein the first interconnect feature extends vertically through the device layer.

Example 28. The integrated circuit of any one of examples 20-27, wherein the first interconnect feature is a conductive via.

Example 29. The integrated circuit of any one of examples 20-28, wherein the first interconnect feature is a buried or backside power rail.

Example 30. The integrated circuit structure of any one of examples 20-29, wherein the first interconnect feature and the second interconnect feature comprise conductive material comprising one or more of copper, ruthenium, molybdenum, tin, indium, antimony, aluminum, or bismuth.

Example 31. The integrated circuit structure of any one of examples 20-30, wherein the first interconnect feature and the second interconnect feature comprise copper.

Example 32. A method of forming an integrated circuit, comprising: forming a substrate and a layer on the substrate, the layer comprising silicon and carbon; forming a device layer on the layer; forming a recess vertically extending through the device layer and stopping at the layer; forming a first interconnect feature within the recess; forming a first interconnect structure above the device layer and including one or more first interconnect layers, the one or more first interconnect layers including second conductive interconnect features; bonding a carrier wafer above the first interconnect structure; removing a section of the substrate below the layer, so as to expose a bottom surface of the layer; and forming a second interconnect structure below the device layer and below the layer, the second interconnect structure including one or more second interconnect layers, the one or more second interconnect layers including third conductive interconnect features, wherein one of the third conductive interconnect features pass through a bottom surface of the layer and contacts the second interconnect feature.

Example 33. The method of example 32, wherein the layer acts as an etch stop layer when forming the recess.

Example 34. The method of any one of examples 32-33, wherein the layer acts as an etch stop layer when removing the section of the substrate below the layer Example 35. The method of any one of examples 32-34, wherein forming the first interconnect feature within the recess comprises: forming a barrier layer on walls of the recess; and subsequent to forming the barrier layer, depositing conductive material within the recess, to form the first interconnect feature.

Example 36. The method of example 35, wherein the barrier layer on a bottom surface of the first interconnect feature is in direct contact with the layer.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit device comprising:
a first layer comprising silicon and at least one of carbon, oxygen, or hydrogen;
a device layer including a plurality of transistors and a dielectric region, the dielectric region being directly on a top surface of the first layer;
a first interconnect structure above the device layer and including one or more first interconnect layers, the one or more first interconnect layers including first conductive interconnect features;
a second interconnect structure below the device layer and the first layer, the second interconnect structure including one or more second interconnect layers, the one or more second interconnect layers including second conductive interconnect features, wherein one or more of the second conductive interconnect features pass through a bottom surface of the first layer, the one or more second conductive interconnect features having a first width measured at or near a top surface of the one or more second conductive interconnect features that is less than a second width of the one or more second conductive interconnect features that is measured at or near a bottom surface of the one or more second conductive interconnect features; and
one or more third conductive interconnect features vertically extending through the dielectric region of the device layer to the top surface of the first layer, the one or more third conductive interconnect features in direct contact with the corresponding one or more of the second conductive interconnect features that pass through the bottom surface of the first layer, the one or more third conductive interconnect features having a third width measured at or near a top surface of the one or more third conductive interconnect features that is greater than a fourth width of the one or more third conductive interconnect features that is measured at or near a bottom surface of the one or more third conductive interconnect features.

2. The integrated circuit device of claim 1, wherein the first conductive interconnect features route signals between the plurality of transistors.

3. The integrated circuit device of claim 1, wherein the second conductive interconnect features route signals (i) between the plurality of transistors and (ii) from or to one or more input or output (I/O) pins that are below the second interconnect structure.

4. The integrated circuit device of claim 1, wherein the second conductive interconnect features route power to the plurality of transistors.

5. The integrated circuit device of claim 1, wherein the first layer has a thickness in the range of 3-20 nm, where the thickness is measured between the device layer and a top one of the one or more second interconnect layers.

6. The integrated circuit device of claim 1, wherein the first layer comprises carbon and at least one of oxygen or hydrogen.

7. The integrated circuit device of claim 1, wherein the one or more third conductive interconnect features include first and second deep conductive vias, each deep conductive via connected to one or more of the transistors by a corresponding conductor of the device layer.

8. The integrated circuit device of claim 1, wherein the one or more second conductive interconnect features include a buried or backside power rail (BPR) to transmit power to a terminal of a transistor of the plurality of transistors.

9. The integrated circuit device of claim 1, wherein at least one of the first conductive interconnect features comprises conductive material, and a barrier layer separating the conductive material from adjacent dielectric material of a corresponding one of the one or more first interconnect layers.

10. The integrated circuit device of claim 1, wherein at least one of the second conductive interconnect features comprises conductive material, and a barrier layer separating the conductive material from adjacent dielectric material of a corresponding one of the one or more second interconnect layers.

11. The integrated circuit device of claim 1, wherein:
at least one of the third conductive interconnect features comprises conductive material;
the integrated circuit further comprises a barrier layer on walls of the at least one of the third conductive interconnect features; and
a bottom surface of a section of the barrier layer on a bottom wall of the at least one of the third conductive interconnect features is coplanar with a top surface of the first layer.

12. The integrated circuit device of claim 11, wherein:
the barrier layer comprises one or more of cobalt, nickel, ruthenium, molybdenum, manganese, titanium, tungsten, tantalum, nitrogen, silicon; and
the conductive material comprises one or more of copper, ruthenium, molybdenum, tin, indium, antimony, aluminum, or bismuth.

13. An integrated circuit device comprising:
a layer comprising silicon and carbon;
a dielectric region directly on a top surface of the layer;
a first interconnect feature extending vertically through the dielectric region to the top surface of the layer, wherein the first interconnect feature is tapered towards a bottom of the first interconnect feature, such that a first width of the first interconnect feature measured at or near a top surface of the first interconnect feature is at least 5% greater than a second width of the first interconnect feature measured at or near a bottom surface of the first interconnect feature; and
a second interconnect feature below the layer and passing through a bottom surface of the layer,
wherein the first interconnect feature is in direct contact with the second interconnect feature,
wherein the second interconnect feature is tapered towards a top of the second interconnect feature, such that a third width of the second interconnect feature measured at or near a top surface of the second interconnect feature is at least 5% less than a fourth width of the second interconnect feature measured at or near a bottom surface of the second interconnect feature, and
wherein the first, second, third, and fourth widths are measured in a horizontal direction that is parallel to a length of the layer.

14. The integrated circuit device of claim 13, further comprising:
a first barrier layer on walls of the first interconnect feature, and a second barrier layer on walls of the second interconnect feature, wherein the first barrier layer of the first interconnect feature and the second barrier layer of the second interconnect feature are in direct contact with each other.

15. The integrated circuit device of claim 14, wherein the bottom surface of the first barrier layer is directly on the top surface of the second barrier layer.

16. The integrated circuit device of claim 13, wherein the layer comprises at least one of oxygen or hydrogen.

17. The integrated circuit device of claim 13, further comprising:

a device layer comprising a plurality of transistors, wherein the dielectric region is part of the device layer.

18. An integrated circuit, comprising:

a device layer comprising one or more semiconductor devices and a dielectric region;

a material layer below the device layer, such that the dielectric region is directly on a top surface of the material layer, the material layer comprising silicon and at least one of carbon, oxygen, or hydrogen;

a first conductive structure extending through an entire thickness of the dielectric region; and a second conductive structure extending through at least a portion of a thickness of the material layer, wherein a bottom surface of the first conductive structure directly contacts a top surface of the second conductive structure, wherein a width at the top surface of the second conductive structure is less than a width of a bottom surface of the second conductive structure, and wherein a width at a top surface of the first conductive structure is greater than a width at the bottom surface of the first conductive structure.

19. The integrated circuit of claim 18, wherein the material layer comprises carbon and at least one of oxygen or hydrogen.

20. The integrated circuit of claim 18, wherein the material layer has a thickness in the range of 3-20 nm.

* * * * *